United States Patent
Sasaki et al.

(10) Patent No.: US 8,222,128 B2
(45) Date of Patent: *Jul. 17, 2012

(54) METHOD FOR INTRODUCING IMPURITIES AND APPARATUS FOR INTRODUCING IMPURITIES

(75) Inventors: Yuichiro Sasaki, Machida (JP); Bunji Mizuno, Ikoma (JP); Cheng-Guo Jin, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/718,549

(22) Filed: Mar. 5, 2010

(65) Prior Publication Data

US 2010/0167508 A1 Jul. 1, 2010

Related U.S. Application Data

(63) Continuation of application No. 11/153,572, filed on Jun. 15, 2005, now Pat. No. 7,709,362, which is a continuation-in-part of application No. PCT/JP2004/001473, filed on Feb. 12, 2004.

(30) Foreign Application Priority Data

Feb. 19, 2003 (JP) ................................ 2003-041123

(51) Int. Cl.
*H01L 21/265* (2006.01)
(52) U.S. Cl. .. 438/510; 438/528; 438/513; 257/E21.435
(58) Field of Classification Search .......... 438/510–532, 438/795–799; 250/492.21
See application file for complete search history.

(56) References Cited

U.S. PATENT DOCUMENTS

| | | | |
|---|---|---|---|
| 5,407,845 | A | 4/1995 | Nasu et al. |
| 5,496,752 | A | 3/1996 | Nasu et al. |
| 5,561,072 | A | 10/1996 | Saito |
| 5,892,235 | A | 4/1999 | Yamazaki et al. |
| 5,897,346 | A | 4/1999 | Yamaguchi et al. |
| 5,915,196 | A | 6/1999 | Mineji |
| 5,956,581 | A | 9/1999 | Yamazaki et al. |
| 5,969,398 | A | 10/1999 | Murakami |
| 6,013,332 | A | 1/2000 | Goto et al. |
| 6,025,252 | A | 2/2000 | Shindo et al. |
| 6,030,863 | A | 2/2000 | Chang et al. |

(Continued)

FOREIGN PATENT DOCUMENTS

CN 1388591 1/2003

(Continued)

OTHER PUBLICATIONS

P. Roca I Cabarrocas, "Plasma enhanced chemical vapor deposition of silicon thin films for large area electronics," Current Opinioin in Solid State and Materials Science 6 (2002) 439-444.

(Continued)

*Primary Examiner* — Savitr Mulpuri
(74) *Attorney, Agent, or Firm* — McDermott Will & Emery LLP

(57) ABSTRACT

A method for introducing impurities includes a step for forming an amorphous layer at a surface of a semiconductor substrate, and a step for forming a shallow impurity-introducing layer at the semiconductor substrate which has been made amorphous, and an apparatus used therefore. Particularly, the step for forming the amorphous layer is a step for irradiating plasma to the surface of the semiconductor substrate, and the step for forming the shallow impurity-introducing layer is a step for introducing impurities into the surface which has been made amorphous.

8 Claims, 9 Drawing Sheets

U.S. PATENT DOCUMENTS

| | | | |
|---|---|---|---|
| 6,037,204 | A | 3/2000 | Chang et al. |
| 6,051,482 | A | 4/2000 | Yang |
| 6,153,524 | A | 11/2000 | Henley et al. |
| 6,159,810 | A | 12/2000 | Yang |
| 6,218,249 | B1 | 4/2001 | Maa et al. |
| 6,265,321 | B1 | 7/2001 | Chooi et al. |
| 6,465,727 | B2 | 10/2002 | Maruyama et al. |
| 6,583,018 | B1 | 6/2003 | Matsunaga et al. |
| 6,653,699 | B1 | 11/2003 | Yang |
| 6,713,819 | B1 | 3/2004 | En et al. |
| 6,893,907 | B2 | 5/2005 | Maydan et al. |
| 7,192,854 | B2 | 3/2007 | Sasaki et al. |
| 7,348,264 | B2 | 3/2008 | Sasaki et al. |
| 7,358,511 | B2 | 4/2008 | Sasaki et al. |
| 7,407,874 | B2 | 8/2008 | Sasaki et al. |
| 7,456,085 | B2 | 11/2008 | Sasaki et al. |
| 7,759,254 | B2 | 7/2010 | Sasaki et al. |
| 2001/0015262 | A1 | 8/2001 | Denpoh |
| 2001/0025999 | A1 | 10/2001 | Suguro |
| 2001/0039107 | A1 | 11/2001 | Suguro |
| 2001/0048115 | A1 | 12/2001 | Yamazaki et al. |
| 2002/0006689 | A1 | 1/2002 | Miyasaka |
| 2002/0070382 | A1 | 6/2002 | Yamazaki et al. |
| 2002/0111000 | A1 | 8/2002 | Kawakami et al. |
| 2002/0112951 | A1 | 8/2002 | Fan |
| 2003/0027393 | A1 | 2/2003 | Suguro |
| 2003/0030108 | A1 | 2/2003 | Morosawa |
| 2003/0077886 | A1 | 4/2003 | Machida et al. |
| 2003/0107036 | A1 | 6/2003 | Yamazaki et al. |
| 2003/0193066 | A1 | 10/2003 | Ito et al. |
| 2003/0211670 | A1 | 11/2003 | Downey |
| 2003/0211713 | A1 | 11/2003 | Suguro et al. |
| 2004/0102017 | A1 | 5/2004 | Chang et al. |
| 2004/0166612 | A1 | 8/2004 | Maydan et al. |
| 2004/0235281 | A1 | 11/2004 | Downey et al. |
| 2004/0241967 | A1 | 12/2004 | Yamazaki et al. |
| 2005/0196961 | A1 | 9/2005 | Zhang et al. |
| 2005/0227463 | A1 | 10/2005 | Ito et al. |
| 2006/0205192 | A1 | 9/2006 | Walther et al. |
| 2006/0264051 | A1 | 11/2006 | Thibaut |
| 2010/0006776 | A1 | 1/2010 | Tanabe et al. |

FOREIGN PATENT DOCUMENTS

| | | |
|---|---|---|
| EP | 1 648 023 A1 | 4/2006 |
| JP | 58-97863 | 6/1983 |
| JP | 63-299328 A | 6/1988 |
| JP | 03-218638 | 9/1991 |
| JP | 5-206045 | 8/1993 |
| JP | 5-206053 | 8/1993 |
| JP | 6-89904 | 3/1994 |
| JP | 6-310533 | 11/1994 |
| JP | 07-142421 | 6/1995 |
| JP | 2530990 B2 | 9/1996 |
| JP | 8-279475 | 10/1996 |
| JP | 9-17867 | 1/1997 |
| JP | 9-199719 | 7/1997 |
| JP | 10-163123 | 6/1998 |
| JP | 2000-12481 | 1/2000 |
| JP | 2002-184710 A | 6/2002 |
| JP | 2003-7636 | 1/2003 |
| JP | 2003-86529 | 3/2003 |
| JP | 2003-528462 | 9/2003 |
| JP | 2004-14878 | 1/2004 |
| JP | 2004-158627 | 6/2004 |
| TW | 484187 | 4/2002 |
| TW | 489396 | 6/2002 |
| TW | 504845 | 10/2002 |
| WO | WO 98/34268 | 8/1998 |
| WO | WO 03/014979 A2 | 2/2003 |

OTHER PUBLICATIONS

United States Office Action issued in U.S. Appl. No. 10/574,863, mailed Oct. 4, 2010.

International Search Report corresponding to application No. PCT/JP2004/001473 dated Apr. 13, 2004.

D. Lenoble et al., "Reliable and enhanced performances of sub-0.1 μm pMOSFETs doped by low biased Plasma Doping", 2000 Symposium on VLSI Technology Digest of Technical Papers, IEEE, pp. 110-111, 2000.

Y. Kiyota, "Surface Reaction Doping using Gas Source for Ultra Shallow Junctions", Japan Society of Applied Physics, 2000.

Y. Kiyota, et al., "Role of hydrogen during rapid vapor-phase doping analyzed by x-ray photoelectron spectroscopy and Fourier-transform infrared-attenuate total reflection", Journal of Vacuum Science and Technology A 16 (1), pp. 1-5, Jan./Feb. 1998.

Y. Kiyota, "Surface Reaction Doping using Gas Source for Ultra Shallow Junction", Silicon Technology No. 39, pp. 9-11, Jun. 2002.

Y. Sasaki et al., "Gas Phase Doping at Room Temperature", Extended Abstracts of International Workshop on Junction Technology, pp. 39-40, 2002.

Y. Sasaki et al., "$B_2H_6$ Plasma Doping with In-situ He Pre-amorphization", 2004 Symposium on VLSI Technology Digest of Technical Papers, 2004 pp. 180-181.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-implanted Punches", J. MGN. Soc. Japan, 2001, pp. 683-686, vol. 25 No. 4-2.

Yamashita, F., et al., "Preparation of a Solid Rotor Composed of a Highly Dense Ring-Shaped RE Bonded Magnet and an Iron-Dust Core", Trans. Magn. Soc. Japan., 2002, pp. 111-114, vol. 2 No. 3.

Mizuno, B., "Ultra Shallo Junction for sub-50NM CMOS—The role of Plasma Doping- ", UJTLab, pp. 10-13, Ultimate Junction Technologies Inc. Dec. 12, 2003.

Sasaki, Y., et al., "$B_2H_6$ Plasma Doping with In-situ He Pre-amorphization", Symposium on VLSI Technology Digest of Technical Papers, 2004, pp. 180-181, IEEE.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Effects from Neutral $B_2H_6$ Gas Phase on Plasma Pretreated Si Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of The Physical Society of Japan, Jun. 1983, pp. 1901-1903, vol. 52 No. 6.

Mizuno, B., "Excitation-Induced Atomic Motion of Self-Trapped Excitons in RbCI: Reorientation and Defect Formation", Journal of The Physical Society of Japan, Sep. 1986, pp. 3258-3271, vol. 55 No. 9.

Mizuno. B., et al., "Effect of Hydrogen on Oxygen Removal from Silicon-Overlayer on Insulator formed by $O^+$ Implantation", pp. 637-640, Semiconductor Research Center, Matsushita Electric Indistrial Co., Ltd. 1987.

Fujita, T., et al., "Electron Paramagnetic Resonance Studies of Defects in Oxygen-Implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV Ion Impelled Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealing", 1994, pp. 485-488, IEDM.

Hori, A., et al., "Fabrication and Characteristics of a Room Temeprature 0.05 μm-CMOS—Possibility and Design Concept of Sub-01 μm MOS Devices-", Technical Report of IEICE, 1995, pp. 41-46, The Institute of Electronics, Information and Communication Engineers.

Mizuno, B., et al. "Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Digest of Technical Papers, 1996, IEEE.

Takase, M., et al., "An evaluation method for a high concentration Profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36 Part 1, No. 3B.

Mizuno. B., et al., "Plasma Doping", pp. 165-170, Central Research Laboratory, Matsushita Electric Industrial Co., Ltd. Jun. 1977.

Kadokura, M., et al., "Analysis and Design of At-Cut Quartz Resonators by three dimensional finite element method", EEP—vol. 19-1, Advances in Electronic Packaging, 1997, pp. 1101-1108, vol. 1, ASME 1997.

Mizuno. B., et al., "Plasma Doping and Plasma-Less Doping of Semiconductor", Mat. Res. Soc. Symp. Proc., 1997, pp. 345-950, vol. 438, Materials Research Society.

Takase, M., et al, "New Doping Technology-Plasma Doping—for Next Generation CMOS process with Ultra Shallow Junction—LSI Yield and surface contamination issues—", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spec roscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., "Helicon Wave Plasma Doping System", Extended Abstract of International Workshop on Junction Technology, 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on Solid State Devices and Materials, Sendai, 1990, pp. 449-452.

Sasaki, Y., et al., "New method of Plasma doping with in-situ Helium pre-amorphization", Nuclear Instruments and Methods in Physics Research B 237, 2005, pp. 41-45, Elsevier B.V.

Jin, C.G., "Ultra shallow $p^+$/n junction formation by plasma doping (PD) and long pulse all solid-state laser annealing (ASLA) with selective absorption modulation", Nuclear Instruments and Methods in Physics Research B 237, 2005, pp. 58-61, Elsevier B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsuhita Electric Industrial Co., Ltd. 1996.

Liu, H., et al., "A New Plasma-Aided Solid-Source Implantation Method for Ultra-Shallow $p^+$/n Junction Fabrication", Engineering Research Center for Plasma-Aided Manufacturing, University of Wisconsin-Madison, 1996.

Mizuno, B., "Plasma Doping into the Side-Wall of a Sub-0.5 μm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabricated by Plasma Doping", Technical Report of IEICE, 1998, The Institue of Electronics, Information and Communication Engineers.

Mizuno, et al., "Ultralow Energy Doping Plasma Doping", Special Issue—Currently Developed Ion Engineering Technology-1, Mar. 1998.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3, Silicon System Research Laboratories, NEC Corporation, Sep. 1, 1999.

Mizuno. B., et al., Plasma doping for fabricating ultra shallow junction, 3p-ZX-4, Matsushit Electric Industrial Co., Ltd., Sep. 1, 1999.

Oda, H., et al., "Demand for Junction Technology in CMOS Transistors", 27a-ZL-1, 49th Applied Physics Lecture Series—Lecture Manuscripts, Comprehensive Lecture within the Area, 2002, Tokai University.

Mizuno, B., et al., "Junction Technologies: Status Quo and Perspectives", 27a-ZL-2, Comprehensive Lectures within the Area, Mar. 27, 2002.

Hata, N., et al., "Characterization of Low-k Dielectrics by Z-ray Scattering—Anisotropy in Pore Diameter and its Suppression", 26p-M-19, 63rd Applied Physics Lecture Series—Lecture Manuscripts, 2002, Niigaka University.

Shimanuki, J., et al., "Behavior of pores in a thin low-k film during anneal—Ex-situ TEM observation method", 26p-M-20, Sep. 24, 2002.

Sasaki, Y., et al., "In-situ Beam Current Monitor for Ion Implanter", 25a-G-1, pp. 768, Sep. 24, 2002.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal ion source for formation of Ni-nano dopant array by single ion implantation", 25a-G-3, 63rd Applied Physics Lecture Series—Lecture Manuscripts, 2002, Niigaka University.

Imamura, K., et al., "Development of key-techniques for co-doping of acceptor and donor by single ion implantation", 25a-G-4, 63rd Applied Physics Lecture Series—Lecture Manuscripts, 2002, Niigaka University.

Yamashita, K., et al., "Development of Flash Lamp Annealer for 300mm Wafers", 29p-ZW-10, 50th Applied Physis Lecture Series—Lecture Manuscripts, 2003, Shinagawa University.

Kubo, Y., et al., "Development of advance single ion implantor", 29p-ZW-11, 50th Applied Physics Lecture Series—Lecture Manuscripts, 2003, Shinagawa University.

Higaki, R., et al., "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physics Lecture Series—Lecture Manuscripts, 2003, Shinagawa University.

Sasaki, Y., et al., "Behavior of H and contamination in the Plasma Doping (PD) process", 29p-ZW-14, 50th Applied Physics Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physics Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Position Annihilation Coincidence Doppler Broadening Methods for Vacancy-Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., "Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy ion implantation in Si II", 30p-ZQ-9, Preprints of the 67th Meeting of the Japan Society of Applied Physics, 2006, Ritsumeikan University.

Matsuda, T., et al., "Spike RTA Induced Changes in Chemical Bondings and Their Depth Profile of Plasma-doped Boron", 30p-ZQ-10, Preprints of the 67th Meeting of the Japan Society of Applied Physics, 2006, Ritsumeikan University.

Tanaka, Y., et al., "8nm ($5E18cm^{-2}$) Ultra Shallow Junction Formation by Double-Pulsed Green Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuin University.

Ohashi, Y., et al., "Effects of Hydrogenation on Chemical Activity of Defects in Polycrystalline Silicon Thin films", 29p-SM-2, Preprints of the 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Dopping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13, Sep. 1990.

Shimizu, N., et al., "Secondary Defect Reduction of Multiple MeV Ion Implatation (II)", 27a-SN-14, Sep. 1990.

Nakata, J., "The Low-Temperature Crystallization and Amorphization Mechanism of Amorphous Si by High Energy Heavy-Ion Beam Irradiation", 27a-SN-15, Sep. 1990.

Matsumoto, M., "The Influence of Pre-oxidation Cleaning on Grotwh of Oxide Film (II)", 28a-D-1, Sep. 1990.

Uchida, H., et al., "Influence of Cleaning methods on Dielectric Breakdown in Thin $Sio_2$", 28a-D-2, Sep. 1990.

Takiyama, M., et al., "Electrical Characteristics of Al MOS Diode Contaminated with Cu-I", 28a-D-3, Sep. 1990.

Shimizu, N., et al., "Secondary Defect Reduction of Multiple MeV Ion Implantation (III)", 31a-X-5, Mar. 1991.

Kimoto, K., et al., "Rapid Thermal Annealing for High-energy Ion Implanted Si (V)" 31a-X-6, Mar. 1991.

Koyama, Y., et al., "Rapid Thermal Annealing for High-energy Ion Implanted Si (VI)" 31a-X-7, Mar. 1991.

Suzuki, H., et al., "Preamorphization by si Double Ion Implantation", 9p-C-12, Oct. 1991.

Takamatsu, H., et al., "Evaluation of Anneal Effect by Photoacoustic Displacement Measurement", 9p-C-13, Oct. 1991.

Shimizu, N., et al., "Effects of Junction Leakage Current Reduction of Additional High Energy Si Ion Implantation", 9p-C-14, Oct. 1991.

Katsumoto, M., et al., "The Effect of NH40H/H2O2 Cleaning on C-V Characteristics of MOS Capacitor", 11p-B-12, Oct. 1991.

Shinno, H., "Ellipsometric Measurements of Silicon Surfaces During Oxidation in R.F. Plasma", 11p-B-13, Oct. 1991.

Maekawa, M., et al., "Effect of H2SO4 Boiling on Silicon Surface", 11p-B-14, Oct. 1991.

Mizuno, B., et al., "Plasma-assisted Impurity Doping for ULSIs", 28p-ZP-10, Mar. 1992.

Itatani, R., "Introductory Talk, Matrial Processing Induced by Electron Beam", 28p-ZQ-1, Mar. 1992.

Tanimura, S., et al., D-255 Total Management System for VLSI Manufacturing, 1994 Spring Conference of the Intitute of Electronics, Information and Communications Engineers, Matsushita Electric Indistrial Co., Ltd.

Maekawa, T., et al., "Annealing of $Ar^+$ Implanted Damage" 30p-ZK-2, Oct. 1991.

Okahisa, M., et al., "Electrical Properties of High Energy Boron-implanted Layers in Si", 30p-ZK-3, Mar. 1992.

Shimizu, N., et al., "Effects of $n^+$ Layer Formation on Junction Leakage Current Using High Energy Ion Implantation", 30p-ZK-4, Mar. 1992.

Kinoshita, K., et al., "Optical Property Change of Silicon in Low Energy Ion Implantation (II)", 28a-ZW-8, Sep. 1993.

Mizuno, B., et al., "A Sputtering Effect During the Ion Implantation with Low Energy", 28a-ZW-9, Sep. 1993.

Kagawa, K., et al., "Effect of Charging During Ion Implantation on Devices", 28a-ZW-10, Sep. 1993.

Murakoshi, A., et al., "Formation of Ultra Shallow Diffusion Layer by Ultra Low Energy Ion Implantation", 26p-ZN-10, Aug. 1995.

Mizuno, B., et al., "Plasma Doping Method", 26p-ZN-11, Aug. 1995.

Fukuda, K., et al., "Fabrication of Ultra Shallow Junction by Spin-on Glass $SiO_2$ Film" 26p-ZN-12, Aug. 1995.

Ishii, M., "Quantitative Analysis of rare-Gas Ion Bombardment Damage of Si Surface using XPS", 26p-ZP-6, Aug. 1995.

Takase, M., et al., "Evaluation Method of Hifh concentration Profile for Low Energy Ion Implantation", 26p-ZP-7, Aug. 1995.

Nakamura, T., et al., "Influence of simultaneously Implanted As+ ions on diffusivity and activation efficency of B atoms implanted into silicon", 26p-ZP-8, Aug. 1995.

Akiyama, H., et al., "The life-time control technique for power devices using high-energy heavy ion radiation", 28a-P-6 Mar. 1996.

Takase, M., et al., "The Indentification of the Region of Ion Implantation Induced Physical Damaged Layer", 28a-P-7, Mar. 1996.

Tamura, F., et al., "Measurement of the minority carrier lifetime for the Si epitaxial layer", 28a-P-8, Mar. 1996.

Mizuno, B., et al., "Room Temperature Vapor Phase Doping (RTVD)", 28p-P-4, Mar. 1996.

Mizuno, B., et al., "Plasma Doping Applicable to sub-1/4 micron PMOS", 28p-P-5, Mar. 1996.

Kujirai, H., et al., "Ultra-shallow, low resistance junction formation by solid-phase diffusion of boron from BSG", 28p-P-6, Mar. 1996.

Takase, M., et al., "Dosage Control by Plasma Emission in Plasma Doping Process", 7a-P-2, Sep. 1996.

Murakami, E., et al., "Formation of Ultrashallow Junctions by Sb Selective δ Doping Technique", 7a-P-3, Sep. 1996.

Kiyota, Y., et al., The Role of Hydrogen during Rapid Vapor-phase Doping Analyzed by FTIR-ATR, 7a-P-4, Sep. 1996.

Takase, M., et al., "Fabrication of Low Sheet Resistance and Shallow Source/Drain Junction with Plasma Doping Process", 29a-G-2, Mar. 1997.

Shimada, N., et al., "Shallow Junction, Formation by Polyatomic Cluster Ion Implantation", 29a-G-3, Mar. 1997.

Ishikawa, T., et al., "Formation of shallow junctions by low-energy implantation", 29a-G-4, Mar. 1997.

Shimada, N., et al., "Shallow Junction Formation by Decaborane Ion Impantation (IV)", 3a-PC-13, Oct. 2, 1997.

Mineji, A., et al., "Shallow Junction Formation by 0.2 keV-single B Ion Implantation", 3a-PC-14, Oct. 2, 1997.

Takase, M., et al., "High Activation Ultra Shallow Source/Drain Junction Fabricated by Plasma Doping", 3a-PC-15, Oct. 2, 1997.

Nishida, S., et al., "the Herzog correction revisited", 7a-YP-8, Sep. 1997.

Ono, S., et al., "Design of a cryogenic current measuring device using a SQUID for low-intensity beam ", 7a-YP-9, Sep. 1997.

Haruyama, Y., et al., "High resolution measurement of $HeH^+$ dissociative recombination with superconductor electron cooler", 7a-YP-10, Sep. 1997.

Tsurubuchi, S., et al., "Excitation cross sections for the resonance states of the Ne by electron impact", 7a-YP-11, Sep. 1997.

Wakabayashi, et al., "IEDM Focusing on high speed and low electric power techniques, Finally the Cu damascene technique for practical applications has arrived", IEDM Conference, 1997, IEEE.

Nakata, K., et al., "Fail Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11, Mar. 28, 1999.

Aoyama, T., et al., "Boron Diffusion in Silicon Dioxide in the Presence of Hydrogen and Fluorine", 30p-ZP-12, Mar. 28, 1999.

Takase, M., et al., "Effect of oxide thickness on boron profile in the plasma doping process", 30p-ZP-13, Mar. 28, 1999.

Mizuno, B., et al., "Plasma Doping", Invitational Lecture, Jul. 6, 2006.

Takase, M., et al., "Plasma doping Technology for the MOS transistor with a channel length below 0.15 µm", Applied Physics, 1999, vol. 68 No. 5.

Sasaki, Y., et al., "Nondestructive Beam Current Monitor Using DC SQUID", pp. 68-76, Jul. 1998.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology, Jan. 26, 1988.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment in plasma doping method", 29p-ZG-15, Preprints of the 51st Spring meeting of the Japan Society of Applied Physics and Related Societies, Mar. 2004, Tokyo University of Technology.

Okashita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa, Y., et al., "Electrical Properties of ultra-Shallow p+ Layers Formed by Plasma Doping", 10a-A-11, PerPreprint of the 66th Meeting of the Japan Society of Applied Physics, 2005, Tokushima University.

Matsuda, T., et al., "Chemical Bonds of Boron Atoms Implanted in a Silicon Surface by Plasma Doping", 10a-A-12, PerPreprint of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric industrial Co., Ltd., Jan. 26, 1988.

Mizuno, B., et al., "ECR Plasma Doping", SDM 88-95, Semiconductor Research Center, Semiconductor Basic Research Lab., Matsushita Electric industrial Co., Ltd., Oct. 21, 1988.

Mizuno, B., et al., "ECR Plasma Doping", Electronic Material, Dec. 1987.

Mizuno, B., "Plasma Doping Technology", Semiconductor, Research Center, Matsushita Electric industrial Co., Ltd., Aug. 1989.

Nakada, K., et al., "D-259 Development of Cleanroom Auto Control System", 1994 Spring Conference of the Society of Electronic information and Communications.

Mizuno, B., et al., "Behavior of Implanted Ions Near the Surface—Outer Diffusion and Self-sputtering", 28p-ZL1, Mar. 1994.

Yamanishi, Y., et al., "Behavior during Oxidation of Nitrogen Introduced by Ion Implantation", 28p-ZL2, Mar. 1994.

Zaizu, Y., et al.,"Effects of Silicon Nitride Films on Boron Enhanced Diffusion and Crystalline Defects due to Boron Implantation", 28p-ZL3, Mar. 1994.

Mizuno, B., et al., "Behavior near Surface of Implanted Ions (cont'd) Self-sputtering and Back-scattering", 20p-ZE-11, Sep. 1994.

Kinoshita K., et al., "Optical Changes in Association with Crystalline Damage due to Low Energy Ion Implantation (IV)", 20p-ZE-12, Sep. 1994.

Hasegawa, K., et al., "Dual Species (B, As) Implantation in Silicon", 28p-ZE-13, Sep. 1994.

Sato, T., et al., "Dose Volume changes and HF Cleansing Before and After Plasma Doping Change dose caused by HF treatment before and after plasma doping", 1a-A-11, 64th Applied Physics Lecture Series—Lecture Manuscripts, 2003, Fukuoka University.

Susuki, K., "High Tilt Angle Ion Implantation in Polycrystalline Si, High tilt angle ion implantation into Polycrystalline silicon", 1p-A-1, 64th Applied Physics Lecture Series—Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series—Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow p$^+$n Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa, Y., et al., "Examination of pre-amorphous layer formation process by He plasma irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd., Jun. 1998.

Higaki, R., et al., "Effects of gas phase absorption into Si substrates on plasma doping process", Sep. 16, 2003.

Lenoble, D., et al., "Fabrication of 60-nm plasma doped CMOS transistors", 2002, IEEE.

Ito, T., et al., "Improvement of Threshold Voltage Roll-off by Ultra-shallow Junction Formed by Flash Lamp Annealing", 2003, Symposium on VLSI Technology Digest of Technical Papers.

Severi, S., et al., "Diffusion-less junctions and super halo profiles for PMOS transistors formed by SPER and FUSI gate in 45nm physical gate length devices", 2004, IEEE.

Chinese Office Action with English translation issued in corresponding Chinese Patent Application No. CN 2004800046349, mailed Mar. 30, 2007.

International Search Report issued in international Patent Application No. PCT/JP2004/015308, mailed Jan. 18, 2005.

Talwar, S., et al., "Study of Laser Thermal Processing (LTP) to Meet Sub 130 nm Node Shallow Junction Requirements," 2000, p. 175-177, 0-7803-6462-7/00, IEEE.

Ito, T., et al., "Flash Lamp Annealing Technology for Ultra-shallow Junction Formation," Extended Abstracts of International Workshop on Junction Technology 2002, 2002, p. 23-26, S3-1 (Invited) ISBN: 4-89114-028-3/029-1, Japan Society of Applied Physics, Japan.

Yamamoto, T., et al., "Impact of Pre-Amorphization for the Reduction of Contact Resistance Using Laser Thermal Process," Extented Abstracts of International Workshop on Junction Technology 2002, 2002, p. 27-30, S3-2, ISBN: 4-89114-028-3/029-1, Japan Society of Applied Physics, Japan.

Kagawa, K., et al., "Influence of pulse duration on KrF excimer laser annealing process for ultra shallow junction formation," Extended Abstracts of International Workshop on Junction Technology 2002, 2002, p. 31-34, S3-3, ISBN: 4-89114-028-3/029-1, Japan Society of Applied Physics, Japan.

European Search Report issued in European Patent Application No. 04710478.1, mailed May 12, 2009.

Japanese Office Action, with English translation, issued in Japanese Patent Application No. 2005-502685, mailed May 19, 2009.

Ito et al "10-15nm Ultrashallow Junction Formation byFlash-Lamp Annealing" pp. 2394-2398 Japanese Journal of Applied Physics, Tokyo, Japan vol. 41, No. 4b Sep. 26, 2001.

Ito, T. et al., "Improvement of Threshold Voltage Roll-Off by Ultra-shallow Junction Formed by Flash Lamp Annealing," 2003, Symposium on VLSI Technology Digest of Technical Papers.

Higaki R., et al. "Effects of gas phase absorption into Si substrates on plasma doping process," European Solid-State Device Research, 2003, 33rd Conference on. Essderc '03 Sep. 16-18, 2003, Piscataway, NJ, USA, IEEE, Sep. 16, 2003, pp. 231-234, XP010676646.

International Search Report issued in International Patent Application No. PCT/JP2005/009949 dated Jul. 5, 2005.

European Supplementary Search Report, with Written Opinion, issued in European Patent Application No. EP 04773759.8/1672683 dated Sep. 2, 2008.

United States Office Action issued in U.S. Appl. No. 10/574,863 dated Dec. 11, 2007.

Tsutsui, K., et al., "Contribution and Control of Neutral Gas Absorption Effects in the Plasma Doping of Boron into Si", 2004, pp. 46-49, IEEE.

Baek, S., et al., "Characteristics of Low-Temperature Preannealing Effects on Laser-Annealed $P^+/N$ and $N^+/P$ Ultra-Shallow Junctions", 2004, pp. 54-57, IEEE.

Semiconductor Applications, Microcavity Engineering, Trench Doping, pp. 662-667, 2000.

R. Siegele, et al., "Helium Bubbles in silicon; Structure and optical properties," Appl. Phys. Lett. 66 (11), Mar. 13, 1995, pp. 1319-1321.

V.F. Reutov & A.S. Sokhatskii, "Helium Ion Bombardment Induced Amorphization of Silicon Crystals," Technical Physic Letters, vol. 38, No. 7, 2002, pp. 615-617.

United States Notice of Allowance issued in U.S. Appl. No. 12/007,736 dated Nov. 18, 2009.

Taiwanese Office Action issued in Taiwanese Patent Application No. 093103328 dated Dec. 16, 2009.

European Search Report issued in European Patent Application No. 04 710 478.1 dated Apr. 19, 2012.

Claverie, A., et al. "On the Amorphization of Silicon By Light Ion Implantation: Ion Flux and Substrate Temperature Effects". Materials Research Society. pp.369-374. vol. 201, Jan. 1, 1991.

METHOD FOR INTRODUCING IMPURITIES AND APPARATUS FOR INTRODUCING IMPURITIES

RELATED APPLICATIONS

This application is a Continuation of U.S. patent application Ser. No. 11/153,572, filed on Jun. 15, 2005 now U.S. Pat. No. 7,709,362, which is a continuation-in-part application of PCT International Application PCT/JP2004/001473, filed on Feb. 12, 2004, claiming priority of Japanese Patent Application No. 2003-041123, filed on Feb. 19, 2003, the entire contents of each of which are hereby incorporated by reference.

TECHNICAL FIELD

The present invention relates to a method for introducing impurities in a manufacturing process of a semiconductor or the like.

BACKGROUND ART

On a surface of a solid substrate or a thin film, an oxide film, where atoms constituting the solid substrate are combined with atmospheric oxygen, or a film, where the atoms are terminated with hydrogen, is generally formed. The film is extremely thin and commonly not thicker than 1 nm. Conventionally, impurities have been physically introduced from above a film such as an oxide film by using a means such as ion implantation. In a word, energy is given to ions, which become impurities, by using an electric field or the like, and the impurities are introduced inside the solid substrate by irradiating the ions to the surface thereof.

Recently, according to miniaturization of devices, a technology for forming a shallow junction has been required. A low-energy ion implantation technique is considered as the conventional technology for forming the shallow junction. The low-energy ion implantation technique is a method for pulling ions out of an ion source with a certain high level of a voltage and decelerating them at a latter stage. This method has been devised for keeping a beam current value with a certain high level and implanting with low-energy. As a result of these devices, formation of a shallow impurity layer of approximately several 10 nm becomes possible, so that it is industrially adapted to a manufacturing process of a semiconductor.

A plasma-doping technique is considered as a notable technique in these years for forming a shallower junction. The plasma-doping technique is a technique for introducing impurities into a surface of an object to be processed (e.g., semiconductor substrate) by contacting plasma including desired particles with the surface of the object to be processed. Because plasma has low-energy of several 100V at the highest, it is suitable for forming a shallow junction, so that experiments for forming shallow junctions of over 10 nm to several 10 nm have been reported.

Further, current experiment achieving the shallowest P-type junction is disclosed in "Technical Digest of Symposium on VLSI Technology, Honolulu, p. 110 (2000)". This describes a depth of a junction of 7 nm.

Still further, a vapor-phase doping method using a gas source is proposed in "(1) International Workshop on Junction Technology (IWJT), p. 19 (2000)", "(2) J. Vac. Sci. Technol. A16, p. 1, (1998)", "(3) Silicon Technology No. 39 18 Jun. 2002" or the like. This is a method capable of forming an impurity diffusion layer of P-type or N-type by heating a semiconductor substrate at a hydrogen atmosphere with an ordinary pressure and supplying $B_2H_6$ or $PH_3$. Hydrogen carrier gas removes a natural oxide film on silicon and keeps its surface clean, thereby preventing surface segregation of impurities such as boron.

Generally, a temperature of not lower than 600° C. is needed to decompose gas. For example, "Silicon Technology No. 39 18 Jun. 2002" discloses as an experimental result that a shallow junction of high concentration is formed by heating a semiconductor substrate at 900° C. and supplying $B_2H_6$ gas of 1 ppm for 40 seconds. According to this experimental result, a depth that boron concentration becomes $1 \times 10^{18}$ cm$^{-3}$ is defined as a depth of a junction, and the depth of the junction is approximately 7 nm which is the same level as that described above.

Yet further, "International Workshop on Junction Technology (IWJT), p. 39-40 (2002)" discloses a technology that the vapor-phase doping methods are executed at room temperature. These are methods that when material is introduced into a solid substrate where a film such as an oxide adheres to its surface, desired particles are stuck or introduced after removing the film such as the oxide. According to the report, a depth of an impurity-introducing layer is 3-4 nm.

As discussed above, by using the plasma-doping technique or the low-energy ion implantation technique, the experiments for forming shallow junctions of over 10 nm to several 10 nm have been recently reported. The current experiment achieving the shallowest P-type junction forms a shallow impurity layer of approximately 7 nm. However, according to progress to further miniaturization of devices, a method for forming shallower impurity layers more simply with low resistance is required.

As a technology for meeting the need mentioned above, because the plasma-doping technique can introduce particles into a semiconductor substrate with small accelerating energy, the plasma-doping technique can form introducing layers shallower than the ion implantation technique. However, though it is small energy, it has accelerating energy, so that there is a limit to form shallower.

In addition, the plasma-doping is known that a radical is supplied to a substrate as dopant. Because a radical does not have an electric charge, it is not accelerated and struck into the substrate. However, it is thought that because it is active, it reacts to a surface of the substrate and is introduced into the substrate. The vapor-phase doping method using a gas source is a technology that an impurity-diffusion layer is formed by supplying dopant, which does not have accelerating energy, into the substrate and reacting its surface. These are positioned as a technology exceeding a limit of a method for irradiating ions having energy onto the substrate.

However, as mentioned above, because the vapor-phase doping method using a gas source decomposes gas, a temperature of not lower than 600° C. has been generally needed. Photoresist can not be used as mask material at such a high temperature. Therefore, $SiO_2$ or the like is needed to be formed and patterned by using a CVD method or the like, thereby increasing processes for forming transistors.

Furthermore, in a case where dopant, which does not have accelerating energy, such as radical or gas molecule in the plasma-doping technique or the vapor-phase doping method, or dopant having extremely small accelerating energy is introduced into the substrate, it is difficult to form an impurity layer of high concentration for a short time.

According to the vapor-phase doping method adapting a method that desired particles are stuck or introduced after removing the film such as the oxide, an impurity layer of high concentration can be formed at room temperature. However, a method for controlling dose amount has not been proposed.

Conventionally, a method for ion-implanting germanium or silicon is known as a technology for making crystal silicon of the semiconductor substrate amorphous. A process for ion-implanting germanium or silicon into a silicon substrate and making its surface amorphous, then ion-implanting impurities such as boron, and then annealing is widely used. The following advantages of making amorphous before ion-implanting impurities are known: 1) Small impurities such as boron are difficult to be introduced deeply in ion-implanting; 2) Impurities can be activated efficiently in annealing because amorphous silicon has a higher absorption coefficient of light than crystal silicon. However, amorphism by using ion-implanting does not have enough efficiency for forming a shallow amorphous layer.

SUMMARY OF THE INVENTION

A method for introducing impurities of the present invention includes:

a step for forming an amorphous layer at a surface of a solid substrate such as a semiconductor substrate; and a step for forming a shallow impurity-introducing layer at the solid substrate which has been made amorphous, where the step for forming the amorphous layer is a step for irradiating plasma to the surface of the solid substrate, and the step for forming the shallow impurity-introducing layer is a step for introducing impurities into the surface which has been made amorphous.

The present invention further includes an annealing step for electrically activating the impurities after introducing the impurities.

In addition, an apparatus for introducing impurities includes at least:

an apparatus for making a surface of a solid substrate amorphous;

an apparatus for introducing desired particles to be impurities; and an anneal apparatus for activating the impurities introduced.

DETAILED DESCRIPTION OF THE PREFERRED EMBODIMENT

Figure 1:
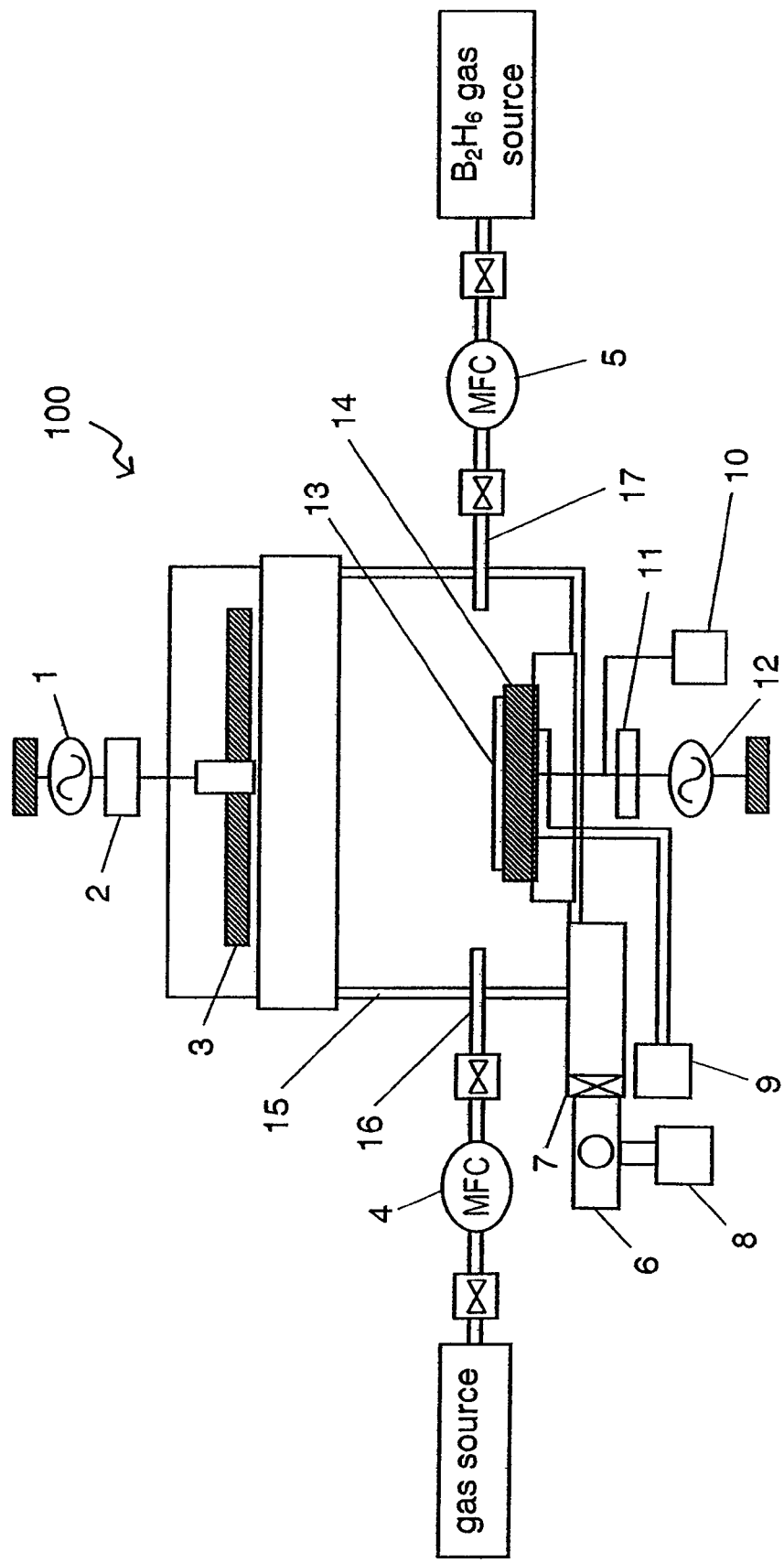
FIG. 1 is a sectional view of an essential part of an apparatus in accordance with an exemplary embodiment of the present invention.

A method for introducing impurities of the present invention is characterized in that after an amorphous layer is formed or while an amorphous layer is formed at a surface of a solid substrate by irradiating plasma to a surface of a solid substrate, desired particles to be impurities are infiltrated, stuck or introduced (hereinafter referred to as "introduced"). By forming the amorphous layer, the desired particles are easy to be introduced into the solid substrate. In addition, in a case where it is adapted to a silicon substrate which is one of the solid substrates, amorphous silicon has a higher absorption coefficient of light than crystal silicon, so that impurities can be activated efficiently in annealing by forming the amorphous layer on the surface, and a low resistance Ultra-Shallow Junction can be realized.

In a case where an ultra-shallow amorphous layer is formed at the surface of the solid substrate, it is preferable to select a means for irradiating plasma to the surface of the solid substrate. Because it uses low-energy plasma compared with conventional amorphism by using an ion implantation technique, shallow amorphous layer is efficiently formed. In a case where only effect that impurities are easily introduced as an extremely low-energy state of gas or radical is desired to be used among effects of an amorphous layer, an amorphous layer can be formed by at least one means selected from a means for irradiating plasma to the surface of the solid substrate, a means for implanting ions to the surface of the solid substrate and a means for adding amorphous layer to the surface of the solid substrate. Less than 70 seconds is preferable as a time for irradiating plasma to the surface of the solid substrate for realizing fine throughputs. Besides, implanting Ge ions is preferable as ion implantation because improvement of electric characteristics is expected.

As the method for introducing impurities, gas or plasma including desired particles is preferably contacted with the surface which has been made amorphous, and infiltrated, stuck or introduced into the surface or neighborhoods of the solid substrate. This is because shallow impurity layers can be formed easily by contacting particles, which do not have accelerating energy or have extremely small accelerating energy, such as gas or plasma. Specifically, plasma, radical, gas, extremely low-energy ions or the like are used. As a concrete name of the method for introducing impurities, it is called gas-doping in a case where it is introduced as a gas condition, and it is called plasma-doping in a case where plasma is contacted with the surface of the solid substrate. In a case where amorphous is formed by using ion implantation technique, it can be efficiently annealed, and impurities can be introduced with extremely small energy. By using these effects, novelty is exhibited. Specifically, in a case where amorphous is formed by using ion implantation technique, a method for contacting gas with the surface of the solid substrate is used as introducing impurities. By using this method, an extremely shallow impurity layer can be formed.

A method for introducing impurities by controlling and adjusting dose amount and a depth of a junction by controlling and adjusting a thickness of the surface of the solid substrate to be made amorphous or a level of amorphism is preferable because sheet resistance can be controlled easily, and device characteristics can be also controlled easily. Specifically, controlling and adjusting of the thickness of the surface of the solid substrate to be made amorphous or a level of amorphism can be performed by changing bias voltage, irradiating time, bias power, ionic species or sheath voltage related to plasma for irradiating the surface of the solid substrate.

Plasma preferably includes rare gas (e.g., argon, neon or helium) or hydrogen. It is thought that rare gas is chemically stable and difficult to undergo chemical reaction, so that a rate for restraining surface adsorption between the desired particles and the surface of the solid substrate is low. As a result, in addition to an effect of introducing impurities by amorphism, an effect of introducing impurities by surface adsorption is expected. Besides, helium, neon and hydrogen have high diffusion coefficients at a high temperature, and do not remain largely at the surface after annealing, so that they are preferable because they rarely adversely affect electrically. Helium is particularly preferable because it has both characteristics (i.e., chemical stability and high diffusion coefficients at a high temperature).

An apparatus for introducing impurities of the present invention includes at least an apparatus for making a surface of a solid substrate amorphous, an apparatus for introducing desired particles, and an apparatus for activating the desired introduced impurities. Therefore, processes of the present invention can be performed.

In addition, combining or integrating at least two apparatuses of an apparatus for making a surface of a solid substrate amorphous, an apparatus for introducing desired particles, and an apparatus for activating the introduced desired impurities is preferable, because the apparatus can be downsized and productivity can be improved.

Furthermore, a method for forming an impurity layer, which is capable of forming extremely shallow impurity layers of high concentration for a short time, capable of controlling dose amount easier than a conventional method, and capable of lowering sheet resistance after annealing, can be provided.

Exemplary embodiments of the present invention are demonstrated hereinafter with reference to the accompanying drawings, however, this invention is not limited to the following embodiments.

FIG. 1 shows apparatus 100 used in an exemplary embodiment of the present invention. Apparatus 100 includes high frequency power supply 1, matching box 2, coil and antenna 3, massflow controllers 4 and 5, turbo molecular pump 6, conductance valve 7, dry-sealed vacuum pump 8, circulator 9, DC power supply 10, matching box 11, high frequency power supply 12 and lower electrode 14. Object 13 to be processed such as silicon substrate is disposed on lower electrode 14.

In FIG. 1, silicon substrate 13 is conveyed into process chamber 15 and disposed on lower electrode 14. Introducing pipe 16 for rare gas and introducing pipe 17 for diborane gas are individually coupled with process chamber 15. Rare gas is used for making the surface of the silicon substrate amorphous by irradiating rare gas plasma to the surface. Diborane gas is made to be plasma state and used for plasma-doping, or introduced into process chamber 15 just as it is and used for gas-doping. A gas flow rate can be controlled individually with massflow controllers 4 and 5.

The following embodiments discuss amorphism of a surface of a solid substrate. However, this invention is not limited to the following embodiments, and it is also adapted to a thin film formed on a solid substrate.

First Exemplary Embodiment

A process for forming an amorphous layer by irradiating plasma is discussed in detail in the first embodiment.

In process chamber 15, a silicon substrate as object 13 to be processed is irradiated with plasma.

Argon, helium or mixed gas of helium of 99.975% and diborane of 0.025% in volume ratio is used.

Figure 2:
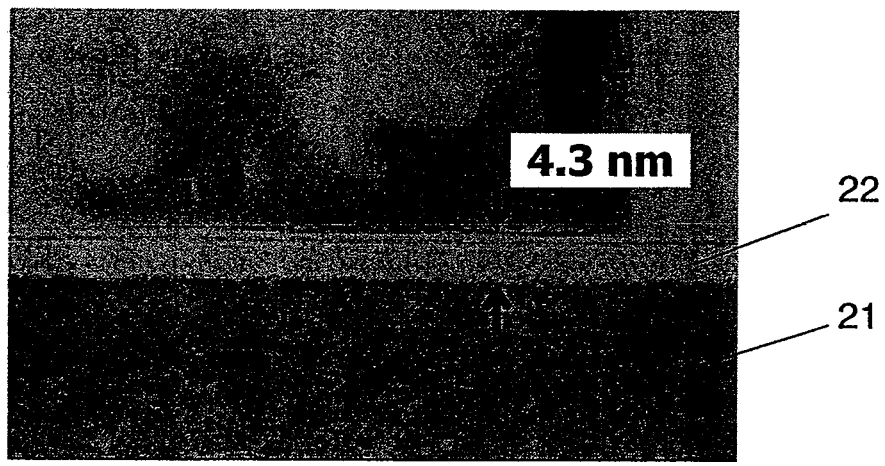
FIG. 2 shows a result of a sectional TEM observation of a substrate in accordance with an exemplary embodiment of the present invention.

First, a silicon substrate is irradiated with argon plasma. Plasma irradiating time of 5 seconds to 60 seconds, and bias voltage of 30V to 310V are used as plasma irradiating condition. Irradiating plasma is stopped, an inside of process chamber 15 is evacuated and then, purged with nitrogen gas. After that, the substrate is removed from process chamber 15. A section of the removed substrate is observed by TEM. FIG. 2 is a sectional TEM image after irradiating argon plasma at 180V of bias voltage for 5 seconds of plasma irradiating time. It shows that amorphous layer 22 of 4.3 nm thickness is formed on silicon substrate 21.

Formation of an amorphous layer can be realized even in a case of using helium plasma. The case of using helium plasma is discussed in a second embodiment.

Still further, irradiating plasma is performed by using mixed gas of helium of 99.975% in volume ratio and diborane of 0.025% at bias voltage of 100V for 60 seconds. A thickness of the amorphous layer is 10 nm. Dose amount of boron is $7.3 \times 10^{14}$ cm$^{-2}$ which is measured by SIMS. As discussed above, forming the amorphous layer and introducing impurities can be performed at the same time.

Second Exemplary Embodiment

Controlling of a thickness of an amorphous layer in irradiating plasma for making amorphous is discussed in the second embodiment.

Figure 3:
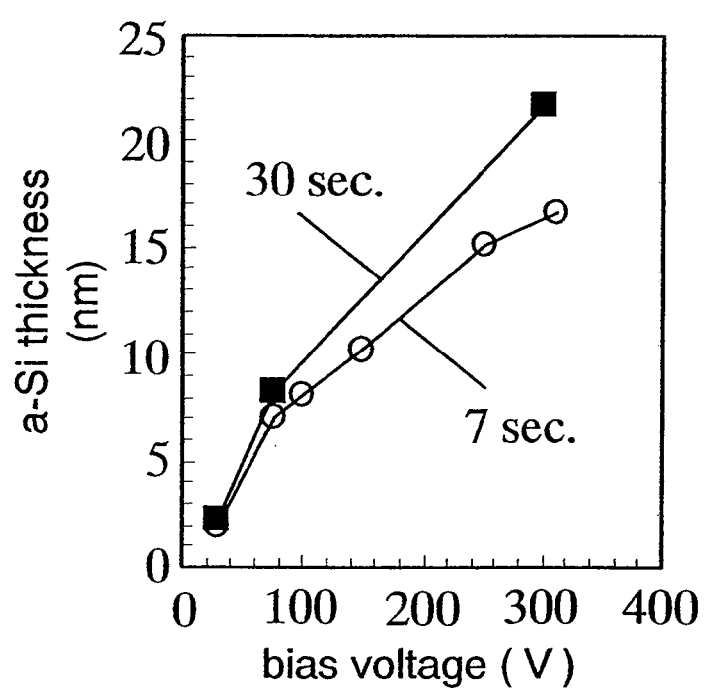
FIG. 3 shows plasma irradiation bias voltage dependence of a thickness of an amorphous layer in accordance with an exemplary embodiment of the present invention.

In process chamber 15, a silicon substrate as object 13 to be processed is irradiated with plasma of helium gas of 100% helium gas concentration. Plasma irradiating time varies to 7 seconds and 30 seconds, and bias voltage varies from 30V to 310V as plasma irradiating condition. A thickness of the amorphous layer of the substrate removed from process chamber 15 is measured with an ellipsometry. FIG. 3 shows relation between bias voltages and the thicknesses of the amorphous layers. It is realized that the amorphous layer of 2 nm to 22 nm can be formed for a short time within 30 seconds by irradiating plasma. In addition, the thickness of the amorphous layer can be controlled by changing the bias voltage.

Furthermore, the thickness of the amorphous layer can be changed by changing the time for irradiating plasma.

Third Exemplary Embodiment

The third embodiment shows examples that the method for introducing impurities of the present invention is adapted to gas-doping. In a case where impurities are introduced by gas-doping, difference of sheet resistance depending on existence or nonexistence of an amorphous layer is examined. Effects that impurities are easily introduced with extremely low energy and low resistance state can be formed after annealing caused by amorphism are described hereinafter.

In process chamber 15, a silicon substrate as object 13 to be processed is irradiated with plasma of argon gas. Plasma irradiating time is 5 seconds and bias voltage is 160V as plasma irradiating condition. Irradiating plasma is stopped, an inside of process chamber 15 is evacuated and then, $B_2H_6$ gas is contacted with a surface of the substrate for 70 seconds. After 70 seconds, supply of $B_2H_6$ gas is stopped, the inside of process chamber 15 is evacuated and then, purged with nitrogen gas. After that, the substrate is removed from process chamber 15.

The removed substrate is annealed at 1100° C. for 3 minutes, and then sheet resistance is measured by using a four probe method. In addition, a substrate which is processed with only plasma irradiation is observed by RHEED, and measured by an ellipsometry in thickness or the like. RHEED stands for Reflection High-Energy Electron Diffraction.

Figure 4:
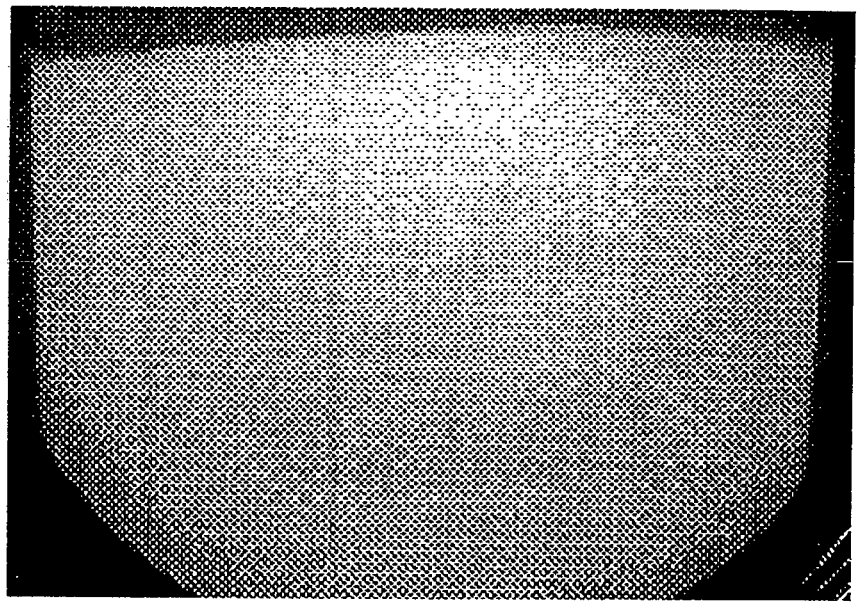
FIG. 4 shows a result of RHEED observation of the present invention.

FIG. 4 shows a result of surface observation by RHEED. As shown in FIG. 4, a bright point which is peculiar to crystal is not observed. It is realized that the surface of the substrate becomes amorphous state by irradiating plasma. Sheet resistance is 5.1E3 ohm/sq.

Yet further, the same experience is performed in a plasma irradiating condition that plasma irradiating time varies from 5 seconds to 70 seconds, and bias voltage varies from 45V to 210V. In all conditions, the surfaces of the substrates become amorphous state. At this time, sheet resistance ranges not lower than 6.5E2 ohm/sq and not higher than 5.1E3 ohm/sq.

Figure 6:
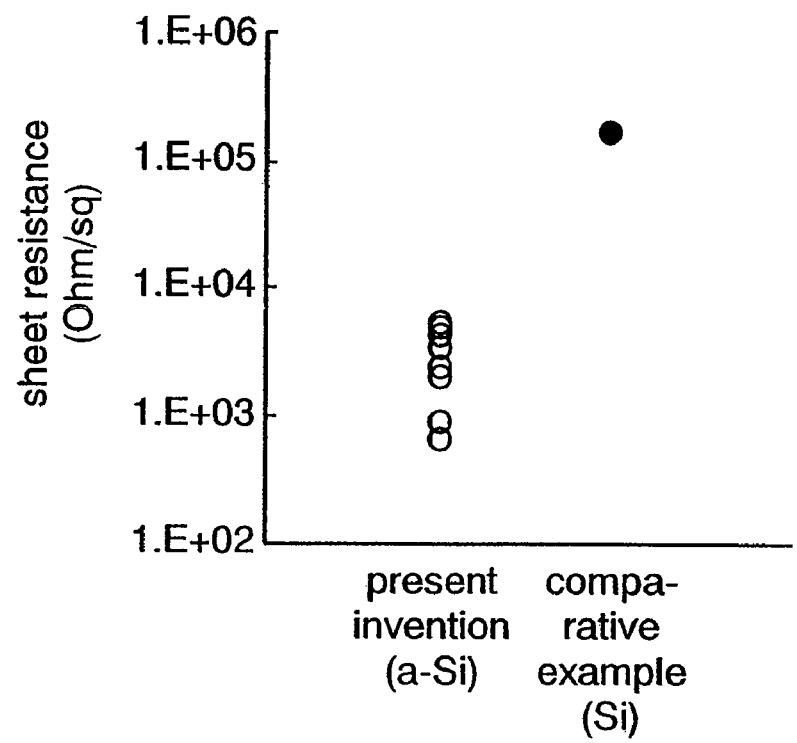
FIG. 6 shows sheet resistance in an exemplary embodiment of the present invention and that of a comparative example.

FIG. 6 shows difference of sheet resistance depending on existence or nonexistence of an amorphous layer. A white circle (○) denotes the results of measurement of sheet resistance, where amorphism is performed, of the present invention. A black circle (●) denotes the results of a comparative example where amorphism is not performed. Sheet resistance of the present embodiment is smaller than that of a comparative example by single digit to two digits. It is thought that by forming the amorphous layer, $B_2H_6$ gas is easily introduced into the substrate without accelerating energy, and the substrate efficiently absorbs light used for annealing, so that sheet resistance is extremely reduced.

Fourth Exemplary Embodiment

The fourth embodiment examines difference of sheet resistance depending on existence or nonexistence of an amorphous layer in a case where a method for introducing impurities is performed by using plasma-doping. Though a depth of a junction after annealing is the same, low resistance can be realized by making amorphous.

For making a surface of a silicon substrate amorphous, in process chamber 15, the silicon substrate as object 13 to be processed is irradiated with plasma of helium gas of 100% helium gas concentration. Plasma irradiating time is 7 seconds and bias voltage is 150V as plasma irradiating condition. Irradiating plasma is stopped, and an inside of process chamber 15 is evacuated. After that, for plasma-doping, it is irradiated with plasma of 5 volume % $B_2H_6$ gas, which has been diluted with helium gas, at bias voltage of 200V for 7 seconds. Irradiating plasma is stopped, the inside of process chamber 15 is evacuated and then, purged with nitrogen gas. After that, the substrate is removed from process chamber 15. Then, for activating the impurities electrically, it is annealed by using spike rapid thermal anneal (spike RTA) whose rate of temperature increasing of 200° C./second, rate of temperature decreasing of 50° C./second, and highest ultimate temperature of 1000° C. Sheet resistance and SIMS profiles of the sample produced discussed above are measured.

Sheet resistance of the sample is 635 ohm/sq. In SIMS profiles, if a depth where boron concentration becomes $1 \times 10^{18}$ cm$^{-3}$ is defined as a depth of a junction, the depth of the junction is 27.2 nm. On the other hand, a sample, which is produced without amorphism in a manner that other conditions are the same, has sheet resistance of 923 ohm/sq and depth of the junction of 28.1 nm. This is discussed in detail in comparative example 2. In a word, by making amorphous using helium plasma irradiation, 30% or lower resistance can be realized in spite of substantially the same depth of the junction.

Fifth Exemplary Embodiment

Figure 7:
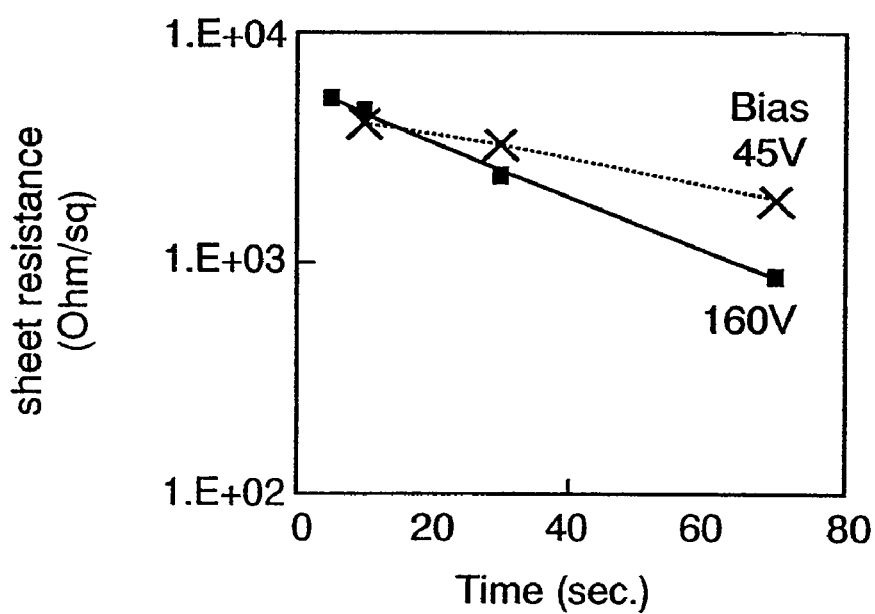
FIG. 7 shows plasma irradiation time dependence of sheet resistance in accordance with an exemplary embodiment of the present invention.

The fifth embodiment examines relation between plasma irradiation time and sheet resistance. FIG. 7 shows the results.

In process chamber 15, a silicon substrate as object 13 to be processed is irradiated with plasma of argon gas. Plasma irradiating time varies from 5 seconds to 70 seconds as plasma irradiating condition. It is performed by two conditions of bias voltages of 45V (shown at ×) and 160V (shown at ■). Processes after irradiating plasma are the same conditions. In other words, irradiating plasma is stopped, an inside of process chamber 15 is evacuated and then, $B_2H_6$ gas is contacted with a surface of the substrate for 70 seconds. After 70 seconds, supply of $B_2H_6$ gas is stopped, the inside of process chamber 15 is evacuated and then, purged with nitrogen gas. After that, the substrate is removed from process chamber 15. The removed substrate is annealed at 1100° C. for 3 minutes, and then sheet resistance is measured by using a four probe method.

In both cases of bias voltages of 45V and 160V, sheet resistance is reduced according as plasma irradiation time is lengthened. From this result, it is realized that sheet resistance can be controlled by changing plasma irradiation time.

In addition, the experimental result mentioned above shows that dose amount increases according as plasma irradiation time is lengthened. It is thought that according as plasma irradiation time is lengthened, degree of amorphism is advanced and introducing amount of $B_2H_6$ gas to the substrate increases.

Sixth Exemplary Embodiment

Figure 8:
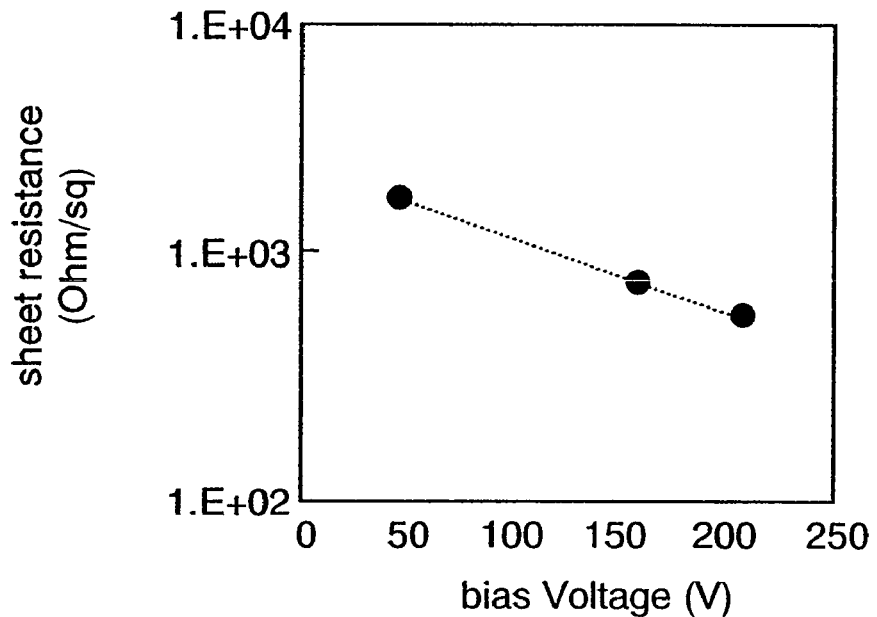
FIG. 8 shows bias voltage dependence of sheet resistance in accordance with an exemplary embodiment of the present invention.

The sixth embodiment examines relation between bias voltage and sheet resistance. FIG. 8 shows the results. Samples are produced in conditions that argon plasma irradiating time is 70 seconds, bias voltage varies to 45V (sample 1), 160V (sample 2) and 210V (sample 3), and other conditions are the same. Conditions which are not particularly described here are the same as the fifth embodiment.

As shown in FIG. 8, sheet resistance decreases according as an absolute value of the bias voltage increases. As a result, sheet resistance of sample 2 and sample 3 decreases not higher than 1.0E3 ohm/sq.

Therefore, it is realized that sheet resistance can be controlled by changing bias voltage.

In addition, the experimental result mentioned above shows that dose amount increases according as the absolute value of bias voltage increases. It is thought that according as the absolute value of bias voltage increases, degree of amorphism is advanced and introducing amount of $B_2H_6$ gas to the substrate increases.

Seventh Exemplary Embodiment

Figure 9:
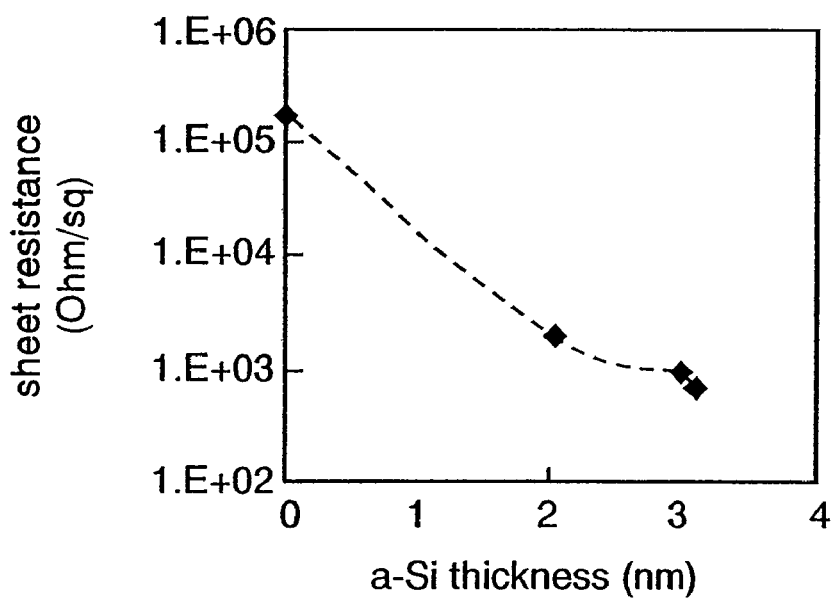
FIG. 9 shows a relation between sheet resistance and a thickness of an amorphous layer in accordance with an exemplary embodiment of the present invention.

The seventh embodiment examines relation between a thickness of an amorphous layer and sheet resistance. FIG. 9 shows the results. A thickness of an amorphous layer of a horizontal axis is a thickness of an amorphous layer formed at a surface of a substrate of samples 1-3 produced in the sixth embodiment and measured with an ellipsometry. A data of an amorphous layer thickness of zero is a result of measurement of a silicon substrate as a comparative example.

As shown in FIG. 9, sample 1 has approximately 2 nm thickness of the amorphous layer, and samples 2 and 3 have approximately 3 nm thickness thereof. Sheet resistance decreases according as the thickness of the amorphous layer increases. From this result, it is realized that sheet resistance can be controlled by changing the thickness of the amorphous layer. Besides, it is realized that degree of amorphism discussed in the fifth and sixth embodiments can be exhibited as the thickness of the amorphous layer.

In addition, the experimental result mentioned above shows that dose amount increases according as the thickness of the amorphous layer increases. It shows that according as the thickness of the amorphous layer increases, introducing amount of $B_2H_6$ gas to the substrate increases.

Comparative Example 1

Comparative example 1 is executed in the same conditions as the third, fifth, sixth and seventh embodiment excluding that it is not made amorphous by irradiating plasma. Comparative example 1 is related to gas-doping and corresponds to the third embodiment. A silicon substrate is conveyed into process chamber 15, an inside of process chamber 15 is evacuated and then, $B_2H_6$ gas is contacted with a surface of the substrate for 70 seconds.

After 70 seconds, supply of $B_2H_6$ gas is stopped, the inside of process chamber 15 is evacuated and then, purged with nitrogen gas. After that, the substrate is removed from process chamber 15. The removed substrate is annealed at 1100° C. for 3 minutes, and then sheet resistance is measured by using a four probe method. Further, dose amount of boron is measured by Secondary Ion Mass Spectrometry (hereinafter referred to as "SIMS"). Still further, the surface of the silicon substrate is observed and measured by RHEED and an ellipsometry before introducing process chamber 15.

Figure 5:
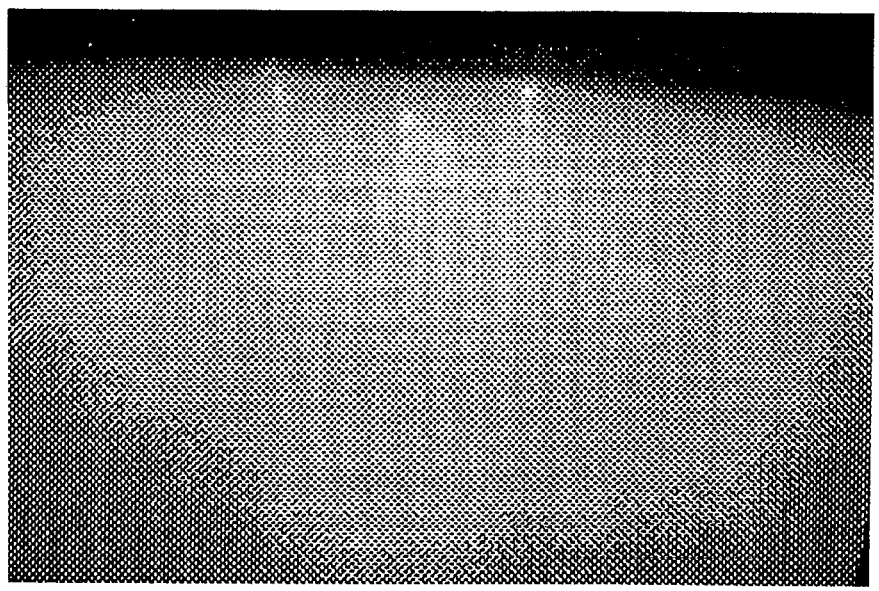
FIG. 5 shows a result of RHEED observation of a comparative example.

FIG. 5 shows a result of surface observation of the silicon substrate of the comparative example by RHEED. Bright points are observed at an upper side of an image shown in FIG. 5, and it is confirmed that they are crystal. Besides, an amorphous layer is not confirmed at the surface even by measurement using the ellipsometry.

In addition, sheet resistance is 1.7E5 ohm/sq. This is larger than the sheet resistance of the present embodiment by single digit or more. From a result of measurement of SIMS, dose amount of boron is 2E12 cm-2. It shows that impurities are hardly introduced.

Comparative Example 2

Comparative example 2 is executed in the same conditions as the fourth embodiment excluding that it is not made amorphous by irradiating plasma. A silicon substrate as object 13 to be processed is conveyed into process chamber 15. After that, for plasma-doping, it is irradiated with plasma of 5 volume % $B_2H_6$ gas, which has been diluted with helium gas, at bias voltage of 200V for 7 seconds. Irradiating plasma is stopped, the inside of process chamber 15 is evacuated and then, purged with nitrogen gas. After that, the substrate is removed from process chamber 15. Then, for activating the impurities electrically, it is annealed by using spike RTA whose rate of temperature increasing of 200° C./second, rate of temperature decreasing of 50° C./second, and highest ultimate temperature of 1000° C. Sheet resistance and SIMS profiles of a sample produced discussed above are measured.

The sample has sheet resistance of 923 ohm/sq and a depth of a junction of 28.1 nm. This sheet resistance is higher than that in the third embodiment which is made amorphous by 30% or more.

According to the present embodiment, amorphism of a surface of a solid substrate is discussed. However, the surface of the solid substrate of the present invention includes a surface of a thin film formed on the substrate as well as the surface of the substrate itself. Accordingly, amorphism at the surface of the thin film formed on the solid substrate is included in the present invention.

As discussed above, the method for introducing impurities of the present embodiment can form an extremely shallow impurity layer at room temperature for a short time. Therefore, an active device (e.g., semiconductor, liquid crystal or biotip) or a passive device (e.g., resistance, coil or capacitor) can be easily produced.

Eighth Exemplary Embodiment

Silicon substrate 81 is irradiated with helium plasma in a condition that bias voltage is 75V, irradiating time is 7 seconds, source power is 1500 W and pressure is 0.9 Pa.

Figure 10:
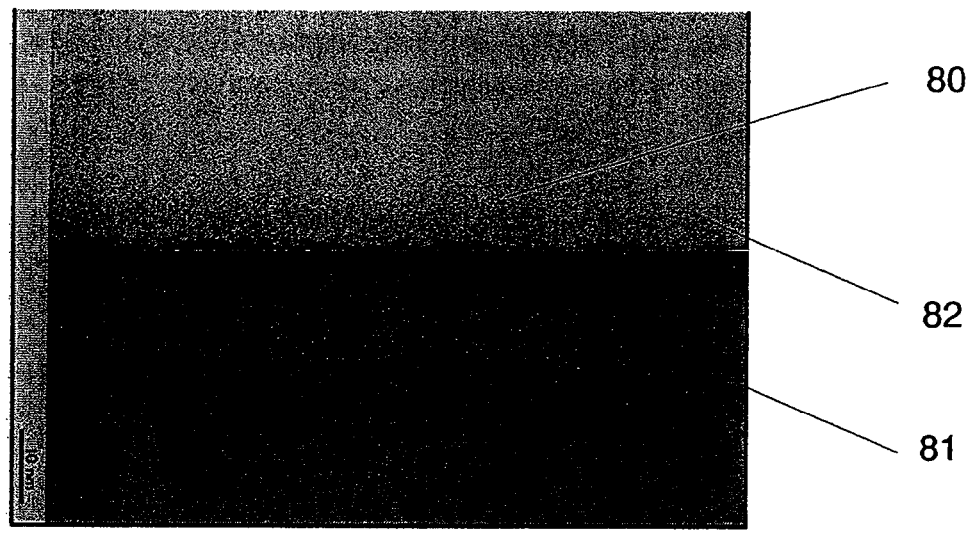
FIG. 10 shows a result of a TEM observation of a silicon substrate after irradiating helium plasma in accordance with an exemplary embodiment of the present invention.

FIG. 10 shows a sectional TEM image of surface 80 of silicon substrate 81 after irradiating the helium plasma. It is realized that amorphous layer 82 is formed thereon.

The present invention is characterized in that even when a chemical element having small atomic weigh such as helium is used, an amorphous layer can be formed on a surface of a silicon substrate for a short time. On the other hand, ion implantation technique, which is a conventional technique, can not form an amorphous layer even if helium ions are implanted for a long time (e.g., a day).

A silicon substrate is irradiated with plasma, where mixture ratio of $B_2H_6$ gas to helium gas is changed, in a condition that bias voltage is 100V, irradiating time is 7 seconds, source power is 1500 W and pressure is 0.9 Pa.

Figure 11:
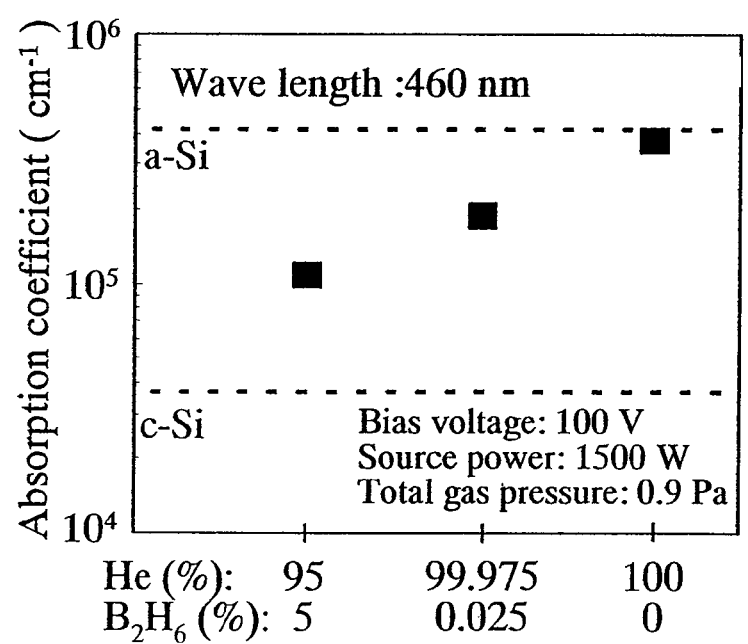
FIG. 11 is a view showing an optical absorption coefficient on a surface of a silicon substrate affected by mixture ratio of $B_2H_6$ gas to He gas.

FIG. 11 is a view showing an optical absorption coefficient on a surface of silicon substrate 81 affected by volume mixing ratio of $B_2H_6$ gas to He gas. The optical absorption coefficient is measured at a wavelength of 460 nm. The optical absorption coefficient of crystal silicon is originally not higher than $4\times10^4$ cm$^{-1}$. However, the optical absorption coefficient can be improved to $1\times10^5$ cm$^{-1}$ or higher by irradiating mixed gas plasma of $B_2H_6$ gas and helium gas ($B_2H_6$ of 5% or less, and He of 95% or more). This shows that the surface of silicon substrate 81 begins to be amorphous. In a word, by using mixed gas plasma of $B_2H_6$ of 5% or less and He of 95% or more in volume ratio, the surface of silicon substrate 81 can be made amorphous at the same time boron is plasma-doped.

The optical absorption coefficient increases by increasing the mixture ratio of helium. This is because an effect of amorphism by helium becomes dominant. Therefore, the optical absorption coefficient reaches the highest in a case of irradiating plasma composed of only helium. A state near perfect amorphous silicon can be formed. Helium plasma is preferably used from this reason mentioned above.

Figure 12:
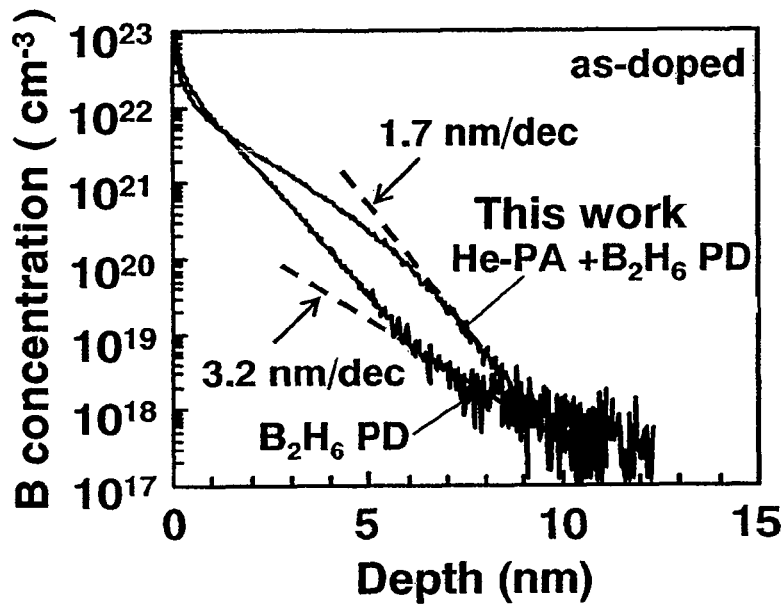
FIG. 12 shows a SIMS profile of boron affected by existence or nonexistence of amorphism by irradiating helium plasma.

Silicon substrate 81 is plasma-doped with mixed gas plasma of $B_2H_6$ and helium ($B_2H_6$ plasma doping, or $B_2H_6$-PD) in a condition that mixture ratio of $B_2H_6$ gas to He gas is 5% to 95% in volume ratio, bias voltage is 100V, source power is 1000 W and pressure is 0.9 Pa and doping time is 7 seconds. Amorphism is performed to one sample by irradiating helium plasma (helium plasma amorphization, or He-PA) before $B_2H_6$-PD. He-PA is not performed to the other sample. FIG. 12 shows a depth profile of boron immediately after $B_2H_6$-PD (as-doped). A case where only $B_2H_6$-PD is performed and a case where He-PA is performed as its preprocessing are compared. A horizontal axis is a depth from the surface of silicon, and a vertical axis is concentration of boron. It is realized that boron can be introduced into a depth range of 10 nm from a top surface in higher concentration in the case where He-PA is performed compared with the case where He-PA is not performed. In addition, abruptness of the profile becomes sharp by performing He-PA. As discussed above, by performing He-PA, the remarkable effect is obtained that boron can be introduced into a shallow part of the silicon substrate in higher concentration and a sharp profile can be obtained. When the profile becomes sharp, there is an effect that minute drain current of MOSFET increases.

Figure 13:
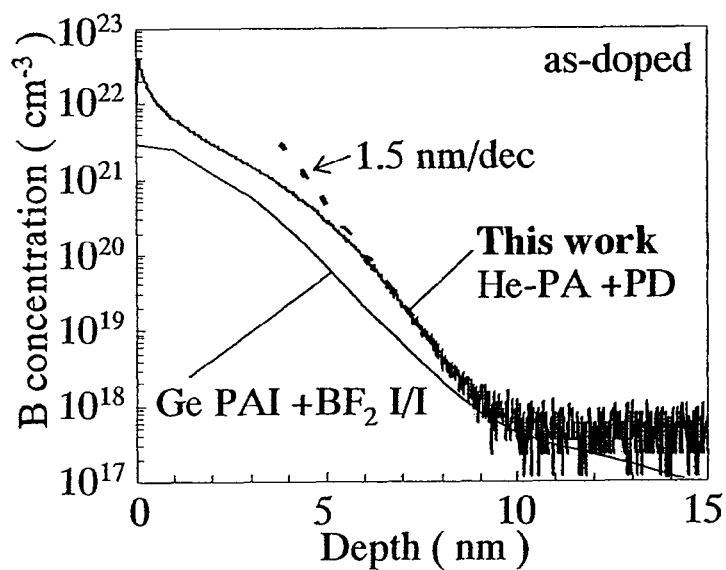
FIG. 13 is a view comparing a SIMS profile of boron in an eighth embodiment (He-PA+PD) with that in a comparative example (Ge PAI+BF2 I/I).

FIG. 13 is a view comparing a SIMS profile of boron in a case of the present embodiment where $B_2H_6$-PD is performed after He-PA with that in a case of the comparative example where boron is implanted by ion-implanting BF2 after amorphism by ion-implanting Ge. According to the present embodiment, an effect is obtained that boron can be introduced into a depth range of 10 nm from a top surface in higher concentration. Furthermore, abruptness of the present embodiment is 1.5 nm/dec which is the highest level in the world. The present embodiment has the remarkable effect that abruptness is also excellent.

Figure 14:
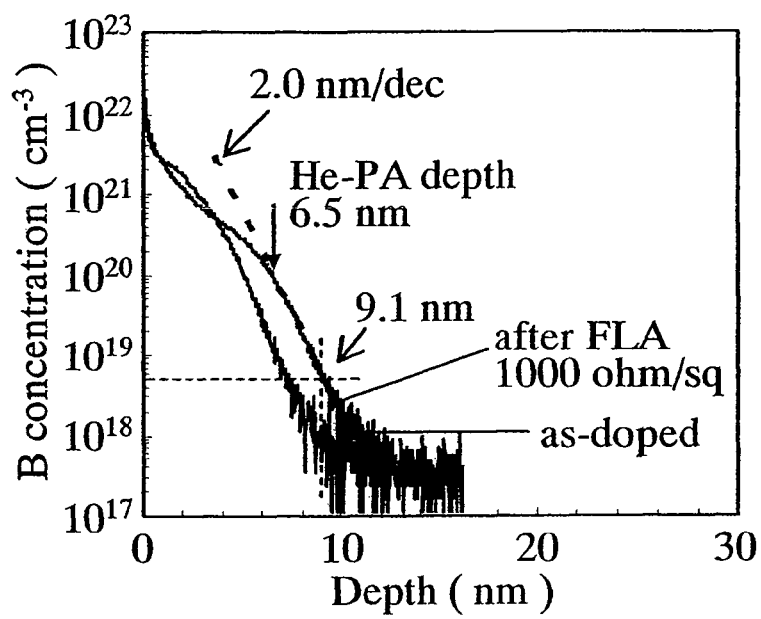
FIG. 14 shows a SIMS profile of boron before and after annealing with a flash lamp.
Figure 15:
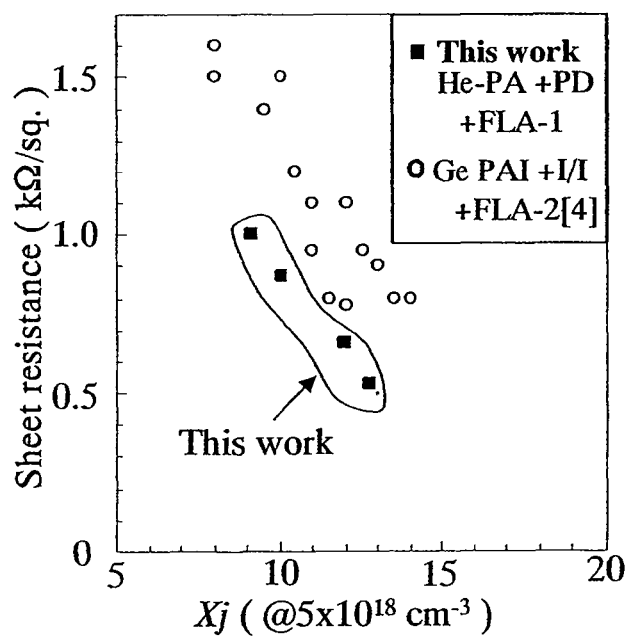
FIG. 15 is a view comparing depth Xj of a junction and sheet resistance Rs in an eighth embodiment (He-PA+PD+FLA-1) with that in a comparative example (Ge PAI+I/I+FLA-2).

$B_2H_6$-PD is performed after He-PA, and then it is heat-treated with a flash lamp. FIG. 14 shows a SIMS profile of boron before and after heat-treatment with the flash lamp. Depth Xj of a junction is defined as a depth where boron concentration becomes $5\times10^{18}$ cm$^{-3}$. FIG. 14 shows Xj of 9.1 nm, so that it is realized that it is extremely shallow. At this time, sheet resistance of an extension electrode is 1000 ohm/sq, so that practical low resistance can be realized as well as shallowness. Xj of 9.1 nm to 14 nm and an extension electrode whose sheet resistance is 1000 ohm/sq to 385 ohm/sq can be produced by changing conditions in the same process. As shown in FIG. 15, if Xj is the same, sheet resistance can be reduced by 30% to 50% compared with white circles of sample [4], which is produced by ion-implanting. As discussed above, the present embodiment that $B_2H_6$-PD is performed after He-PA has the remarkable effect that Xj is 9.1 nm to 14 nm, which is extremely shallow depth of the junction, and sheet resistance can be reduced. This solves the conventional problem that when an extremely shallow junction is formed, sheet resistance increases, so that a practical extension electrode can not be formed.

In a case where amorphism is performed by helium plasma, helium is introduced into the substrate. In a case where amorphism is performed by hydrogen plasma, hydrogen is introduced into the substrate. In a case where $B_2H_6$-PD is performed after He-PA and in a case where amorphism is performed by mixed plasma of He and $B_2H_6$ in the same time of introducing boron, helium and hydrogen are introduced in addition to boron. A state of helium and hydrogen after annealing is described hereinafter.

Figure 16:
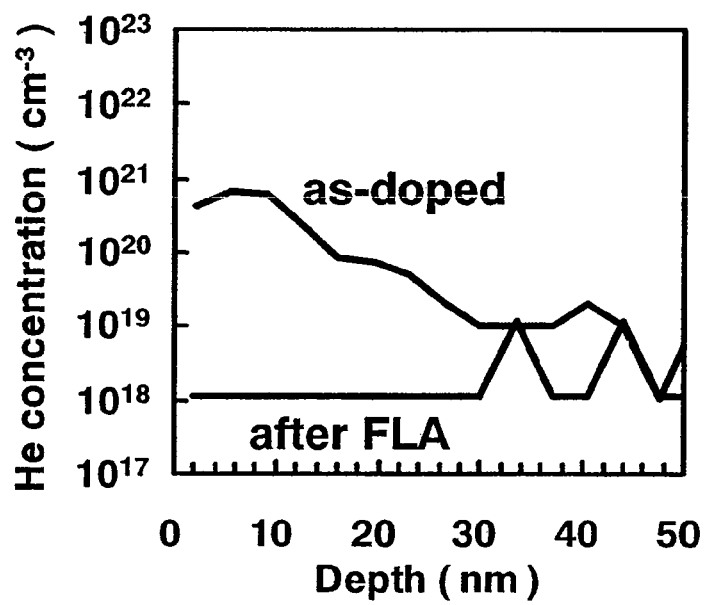
FIG. 16 shows a SIMS profile of helium before and after annealing with a flash lamp.

FIG. 16 shows a SIMS profile of helium before and after annealing with a flash lamp in a case where $B_2H_6$ PD is performed after He-PA and then heat-treated with a flash lamp (Flash Lamp Anneal, or FLA). A background of helium measured by SIMS is $1\times10^{18}$ cm$^{-3}$. Helium concentration seems to be constant in the profile after annealing with the flash lamp, however, it is the background due to the measurement. It shows actual helium concentration is not higher than $1\times10^{18}$ cm$^{-3}$. Helium of approximately $8\times10^{14}$ cm$^{-3}$ has been certainly introduced immediately after plasma-doping. However, helium hardly exists inside the silicon substrate after annealing.

Figure 17:
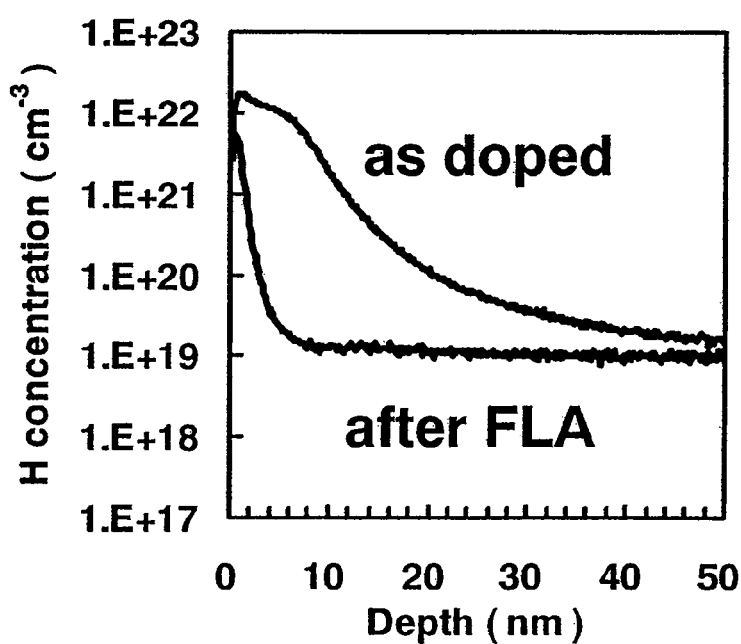
FIG. 17 shows a SIMS profile of hydrogen before and after annealing with a flash lamp.

FIG. 17 shows a SIMS profile of hydrogen. A background of hydrogen measured by SIMS is $1\times10^{19}$ cm$^{-3}$. Hydrogen of high concentration seems to remain at approximately 1 nm from a top surface after annealing. It is thought that material, which is adsorbed to silicon in a hydroxyl-group form at the top, is measured so as to be struck into the inside of the silicon substrate by oxygen ions used in SIMS measurement, so that hydrogen does not remain at the inside. It shows actual hydrogen concentration is not higher than $1\times10^{19}$ cm$^{-3}$. As discussed above, hydrogen hardly exists inside the silicon substrate after annealing.

It is thought that H or He is extremely small atom (its atomic weight is smaller than boron) and its diffusion coefficient in the silicon is higher than boron by several digits, so that it is passed outside the silicon substrate as gas or largely diffused in a depth direction and diluted in low concentration. As shown in FIG. 14, boron is hardly diffused and remains the shallow part of the silicon substrate even after annealing, and has an effect of lowering electric resistance. On the other hand, as shown in FIGS. 16 and 17, impurities excepting boron (i.e., H and He) do not exist at least in high concentration after annealing. Therefore, it is preferable because they hardly have an adverse effect electrically.

As discussed above, amorphism performed by helium plasma or hydrogen plasma has an effect that helium or hydrogen hardly remains inside the silicon substrate, so that they hardly have an adverse effect electrically. This effect can not be obtained by conventional amorphism performed by ion implantation technique of germanium, silicon or argon. This is because an ion having great atomic weight is required to be used for making amorphous by ion implantation technique. In a word, if a chemical element having great atomic weight is not used, amorphism can not be performed. However, it is well known that a chemical element having great atomic weight has a small diffusion coefficient, so that it remains inside the silicon substrate even after annealing. As mentioned above, according to amorphism performed by ion implantation technique, in a case where a chemical element having a great diffusion coefficient is used, amorphism itself can not be performed, and in a case where a chemical element (i.e., germanium, silicon or argon) which is presently disclosed to be capable of making amorphous is used, the used chemical element remains inside the silicon substrate after annealing. Accordingly, it does not have the effect which the present invention has.

INDUSTRIAL APPLICABILITY

As discussed above, the present invention provides a method for forming an impurity layer, which is capable of forming extremely shallow impurity layers of high concentration at room temperature for a short time, capable of controlling dose amount easily, and capable of lowering sheet resistance after annealing.

The invention claimed is:

1. A method for introducing impurities, comprising:
a first step for irradiating a plasma containing He to a surface of a substrate so as to form an amorphous layer at the surface of the substrate, wherein an irradiating time regarding the plasma is not shorter than 5 second (inclusive) and shorter than 70 second (inclusive), and the substrate is a single crystalline silicon substrate,
a second step for introducing impurities into the surface of the substrate, wherein the second step is a step for plasma-doping the impurities, and
an annealing step after the second step,
wherein the first step is performed at the same time as the second step,
the annealing step is a step for activating the impurities, and
a bias voltage in time of irradiating the plasma is more than 30V (inclusive) and less than 310V (inclusive).

2. The method for introducing impurities of claim 1, wherein the plasma is primarily comprised of He.

3. The method for introducing impurities of claim 1, wherein the plasma is comprised of only He.

4. The method for introducing impurities of claim 1, wherein the first step comprises a step for controlling a thickness of the amorphous layer by changing at least one condition of bias voltage, irradiating time, bias power, ionic species and sheath voltage related to the plasma for irradiating the surface of the substrate.

5. A method for introducing impurities, comprising:
a first step for irradiating plasma containing He to a surface of a film so as to form an amorphous layer at the surface of the film, wherein an irradiating time regarding the plasma is not shorter than 5 second (inclusive) and shorter than 70 second (inclusive), and
the substrate is a single crystalline silicon substrate,
a second step for introducing impurities into the surface of the film, wherein the second step is a step for plasma-doping the impurities, and
an annealing step after the second step,
wherein the first step is performed at the same time as the second step,
the annealing step is a step for activating the impurities, and
a bias voltage in time of irradiating the plasma is more than 30V (inclusive) and less than 310V (inclusive).

6. The method for introducing impurities of claim 5, wherein the plasma is primarily comprised of He.

7. The method for introducing impurities of claim 5, wherein the plasma is comprised of only He.

8. The method for introducing impurities of claim 5, wherein the first step comprises a step for controlling a thickness of the amorphous layer by changing at least one condition of bias voltage, irradiating time, bias power, ionic species and sheath voltage related to the plasma for irradiating the surface of the film.

* * * * *